United States Patent [19]

d'Alayer de Costemore d'Arc

[11] Patent Number: 5,530,761
[45] Date of Patent: Jun. 25, 1996

[54] AUTOMATIC PROCESS OF ADJUSTMENT OF THE VOLUME OF SOUND REPRODUCTION

[75] Inventor: Stephane M. d'Alayer de Costemore d'Arc, Genappe, Belgium

[73] Assignee: Staar S.A., Brussels, Belgium

[21] Appl. No.: 265,002

[22] Filed: Jun. 24, 1994

[30] Foreign Application Priority Data

Jun. 30, 1993 [BE] Belgium .................................. 9300676

[51] Int. Cl.$^6$ .............................. H03G 3/00; H03G 3/24
[52] U.S. Cl. ............................. 381/57; 381/107; 381/108
[58] Field of Search ................................. 381/56, 57, 58, 381/73.1, 71, 94, 107, 108

[56] References Cited

U.S. PATENT DOCUMENTS

| | | | |
|---|---|---|---|
| 3,497,622 | 2/1970 | Markin et al. ................................. | 5/52 |
| 3,934,084 | 1/1976 | Munson et al. ........................... | 381/57 |
| 4,254,303 | 3/1981 | Takizawa ................................ | 381/107 |
| 4,476,571 | 10/1984 | Tokumo et al. ........................... | 381/57 |
| 4,479,237 | 10/1984 | Sugasawa ................................ | 381/107 |
| 4,628,526 | 12/1986 | Germer ..................................... | 381/57 |
| 4,641,344 | 2/1987 | Kasai et al. ............................... | 381/57 |
| 5,081,682 | 1/1992 | Kato et al. ................................ | 381/108 |
| 5,204,971 | 4/1993 | Takahashi et al. ..................... | 455/185.1 |

FOREIGN PATENT DOCUMENTS 406021832A 1/1994 Japan ...................... 381/57

OTHER PUBLICATIONS

AES, vol. 4, No. 7/8, 1993, Jul.–Aug., 4,742,310, "43.88.Lc Automatic Sound Volume Controlling Device ...", M. Kato et al., 3 May 1988; Filed in JP 16 Jul. 1985.

Konsumelektronik, vol. 35, No. 17, Aug. 1986, Munchen, Deutschland, pp. 115–118, "Störgeräuschabhängige Lautstärkeau–Tomatik ...", Prof. Dr.–Ing. Horst Germer et al. (Part. Trans.).

J. Audio Eng. Soc., vol. 39, No. 1/2, 1991 Jan.–Feb., pp. 64–65, Forum, "Acoustical Negative Feedback for Gain Control", David Klepper.

*Primary Examiner*—Scott A. Rogers
*Assistant Examiner*—Jerome Grant, II
*Attorney, Agent, or Firm*—Leydig, Voit & Mayer

[57] ABSTRACT

A control process and apparatus which automatically ensures adjustment of the volume of sound delivered by a sound reproduction source, such as a car radio, as a function of the ambient sound signals so that the user has the sensation of listening to an audio program which is maintained at the same sound level regardless of variations in disturbing noise level. The apparatus uses a microphone which picks up the ambient sound signals and employs computer circuitry operating under program control for determining the average level of the ambient sound signals; circuits are used which supply signals to the computer representing the level of the sound delivered by the sound reproduction source; under program control the computer determines the difference in level between the ambient sound signal and the delivered sound signal to obtain a result ($S_{OM}$) representing the value of the user's listening comfort. This value ($S_{OM}$) is subtracted from subsequent measurements of the difference between the value of the ambient sound signal and that of the delivered sound signal. This provides the sign and the magnitude of any difference (S) which is then compared with value regions quantifying this difference (S). As a function of a coefficient of membership in each of the value regions, the control process determines, with the aid of possible regions of adjustment, the value of an adjustment factor to be applied to adjust the volume of sound delivered by the sound source.

10 Claims, 5 Drawing Sheets

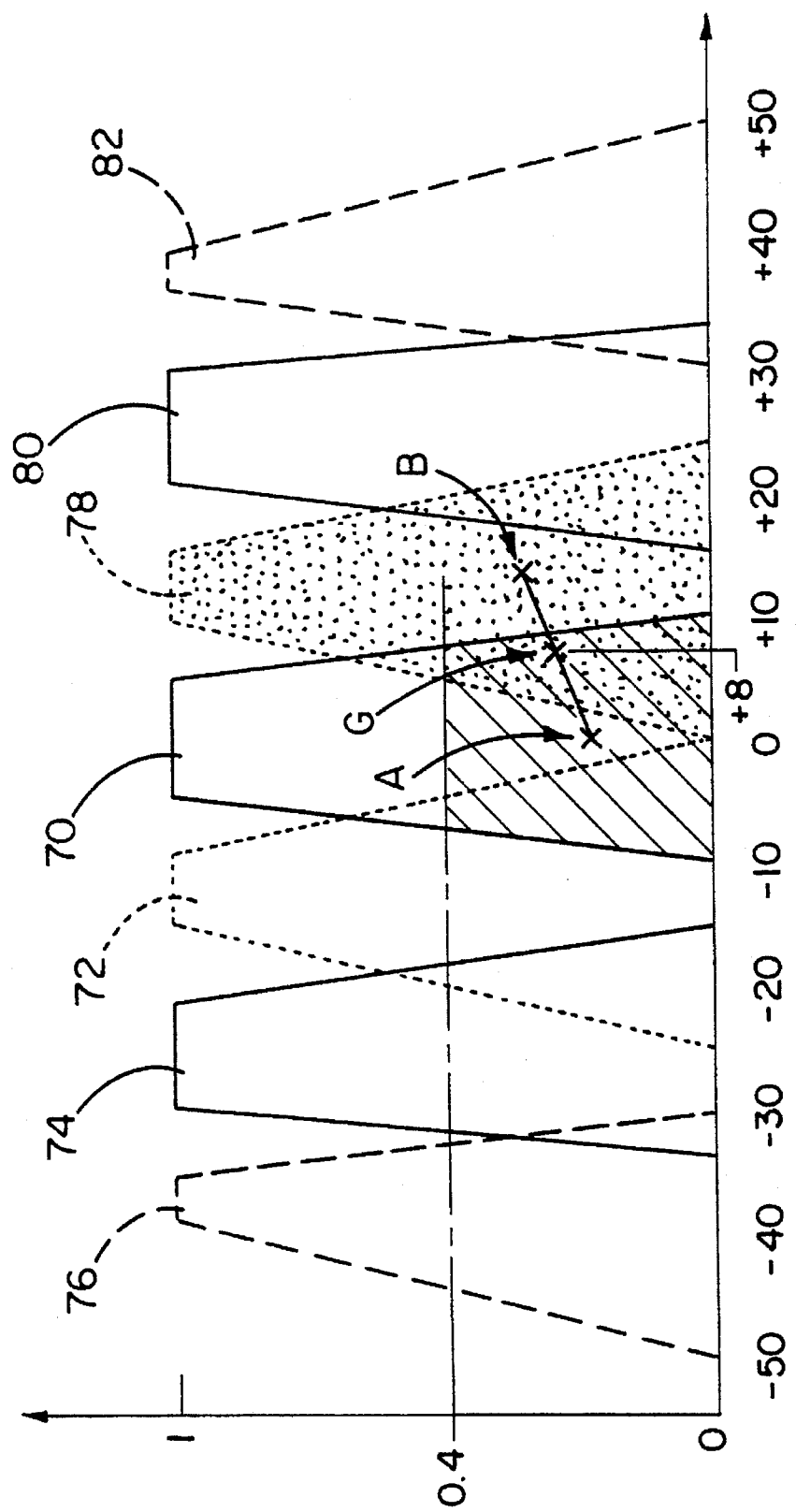

AUTOMATIC PROCESS OF ADJUSTMENT OF THE VOLUME OF SOUND REPRODUCTION

The present invention relates to apparatus for sound reproduction such as radios, televisions, cassette or record players, etc. and concerns more particularly the control thereof ensuring adjustment of the level of sound reproduction.

It finds its application in particular in the units used in surroundings containing background noise or sources of noises or disturbances the sound level of which interferes with, or impairs listening to, the program reproduced by the said units.

BACKGROUND

By way of example, audio units such as radios, cassette or record players or combinations of them, installed in vehicles, require from the user frequent adjustment of the so-called "volume" control so as to listen to the reproduced program with the same ease despite the ambient noise which, for its part, varies as a function of the various sources of noise, not only peculiar to the vehicle itself, namely engine, road/tire, aerodynamic and bodywork noise etc., but also as a function of the noises created by neighboring sources such as the other vehicles (for example trucks, etc.) or else due to the surrounding conditions (for example tunnels, etc.).

In order to alleviate some of these disadvantages, various devices or processes for automatic adjustment of volume have been proposed in the past based on automatic control of the gain of the amplifier and using either a microphone placed near the engine compartment or the vehicle's engine rev counter as noise measurement source. As is readily understood, such devices and in particular those described in U.S. Pat. No. 4,641,344, take into account only part of the so-called disturbing noises and, additionally, with engine compartments being ever better insulated, these devices are of only average effectiveness.

Moreover, whereas the rev counter gives a reliable indication of the engine noise, it gives no valid indication regarding the speed of the vehicle and hence the road and aerodynamic noises etc., which themselves become predominant on the road or motorway.

U.S. Pat. No. 4,641,344, also proposes taking information from each potential source of noise (speed, pressure, fan, rev counter, position of the windscreen wipers, of the steering wheel, condition of the road, etc.) but this entails many sensors and, therefore, much too high a cost. Additionally, this kind of device is peculiar to the vehicle in which it is installed.

Devices of the same kind as those described earlier have also been proposed, but based on measuring the subsonic part of the noise as, for example, the device described in U.S. Pat. No. 4,476,571. However, the user being sensitive to a wider range of frequencies, these devices are not very effective.

Furthermore, systems like those described, for example, in U.S. Pat. Nos. 3,497,622 and 4,628,526 have been proposed which measure, on the one hand, with the aid of a microphone, all the signals perceived by the user (reproduced signals+noise) and, on the other hand, the signals applied to the loudspeakers; a control signal is obtained representing the difference between these two signals (microphone and loudspeaker), which control signal is then used to modify the gain of the amplifier.

However, such systems are either sensitive to the blanks contained in the programs and hence have to be equipped with circuits for detecting these blanks, so as to avoid any adjustment due to the presence of said blanks (thus complicating the construction and raising the price; see U.S. Pat. No. 4,628,526) or require the presence of two amplifiers (see U.S. Pat. No. 3,497,622) which not only entails a higher cost but is also a potential source of problems since two amplifiers are in danger of operating in the opposite direction and hence of producing the reverse effect to that desired.

A further system disclosed in the publication "Konsumelektronik" is designed to cope with blanks by making use of the mean values of the microphone and radio signals. However, in this system, there is an adjustment factor which is determined by the maximum and minimum values of the microphone and radio signals and thus which is variable.

$$V = \frac{Mo - Mu}{Ro - Ru}$$

$Mu$ = minimum microphone
$Mo$ = maximum microphone
$Ro$ = maximum radio
$Ru$ = minimum radio Use of an adjustment factor determined in this manner is a potential source of instability and thus means are provided to correlate successive values. As one can easily understand, such systems are rather complicated not only to work-out but also to properly adjust.

Moreover, a device such as that described by U.S. Pat. No. 4,628,526, which is based on the detection of the envelope of the signal, (derived signal) is extremely sensitive to the instantaneous variations in the noise and hence generates far too many corrections, quickly becoming unpleasant.

U.S. Pat. No. 4,677,389 proposes a device for distinguishing between real background noise and speech in a given environment (e.g., a car). However, the means proposed are rather complicated and require additional components and software that makes the device too expensive. Moreover, the means maintain the gain value fixed when speech is detected, although the real background noise might change and thus require an adjustment.

SUMMARY OF THE INVENTION

The principal aim of the present invention is, therefore, to alleviate all the aforesaid disadvantages, doing so by providing a method and apparatus which are simple, effective and economical not only to implement but also to produce on a large scale.

A second aim of the invention is to take into account all the impairing or disturbing noises that are perceived by the user.

A third aim of the invention is to provide listening comfort such that the user has the sensation of listening to an audio program which is maintained at the same sound level regardless of the source and intensity of the disturbing noise.

A fourth aim of the invention is to provide a device whose capacity of adjustment is both prompt so as to react to sudden variations in the noise level and also slow so as not to give the sensation, upon slight variations in the noise level, that the level of reproduction of the program is varying continually.

A fifth aim of the invention is to provide a device which can be easily integrated into units of the car radio type without raising the cost price and hence sales price thereof.

A sixth aim of the invention is to provide a device requiring no adjustment subsequent to leaving the factory.

A seventh aim of the invention is to provide a device requiring neither correction circuits in the event that "blanks" are present in the amplified signals, nor a second amplifier.

A further aim of the invention is to provide extremely simple means for accurately distinguishing between real background noise and speech while still adjusting the gain of the amplifier according to the value of the real background noise.

With a view to achieving these objectives, the process and apparatus in which the invention is embodied is incorporated in a sound reproduction source such as a radio unit for cars and provides automatic control of the adjustment of volume of sound delivered from the source. The apparatus is constructed to carry out a process which involves the steps of:

(a) providing an ambient sound signal (MICRO) having a value representing level of ambient sound including sound delivered from the source and disturbing noises perceived by a user;

(b) providing a delivered sound signal (LS) having a value representing level of sound delivered by the sound reproduction source;

(c) determining instantaneous values of $$S_O = MICRO - a\, LS$$

and computing an average value ($S_{OM}$) based on a number of instantaneous values of $S_O$ during an initialization phase representing a user's listening comfort level taking into account initial intensity of disturbing noises;

(d) periodically, subsequent to the initialization phase, repeating steps (a) and (b);

(e) determining, with the results of step (d) and the value of $S_{OM}$ obtained during the initialization phase, instantaneous values of $$S = MICRO - a\, LS - S_{OM}$$

and computing an average value of S based on a number of instantaneous values of S to provide a difference value, having both magnitude and sign, with respect to the value of the user's listening comfort level $S_{OM}$ thereby taking into account a difference in intensity of disturbing noises; and (f) determining an adjustment factor based on the average value of S and adjusting the volume of sound delivered by the sound reproduction source in accordance with the adjustment factor so that the user has the sensation of listening to delivered sound which is maintained at a substantially constant level regardless of intensity of the disturbing noises.

Other advantages and features will appear from the description given hereinbelow of a preferred embodiment of the invention to which diverse modifications may be made without departing from the invention.

BRIEF DESCRIPTION OF DRAWING FIGURES

FIG. 1 represents diagrammatically a radio in which the process is implemented,

FIG. 2 is a simplified electronic diagram of a circuit providing for the implementation of the process which is the subject of the invention, FIG. 3 is a simplified flow chart of the control program providing for the implementation of the process, FIG. 4 is a graph showing the degree of membership in various noise levels, FIG. 5 is a graph showing the degree of membership in various levels of adjustment of the volume.

FIGS. 6, 6a, and 6b are illustrations of a signal, a sampled signal, and a sampled signal with replaced samples, respectively.

In order to simplify the explanation and to avoid cluttering the figures, only the elements essential to the understanding of the invention have been represented therein.

DETAILED DESCRIPTION OF PREFERRED EMBODIMENTS

Figure 1:
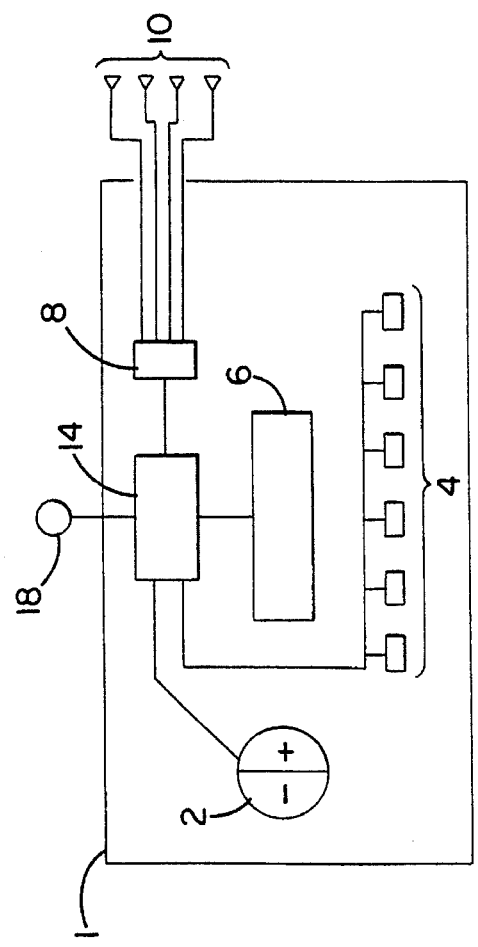
Figure 2:
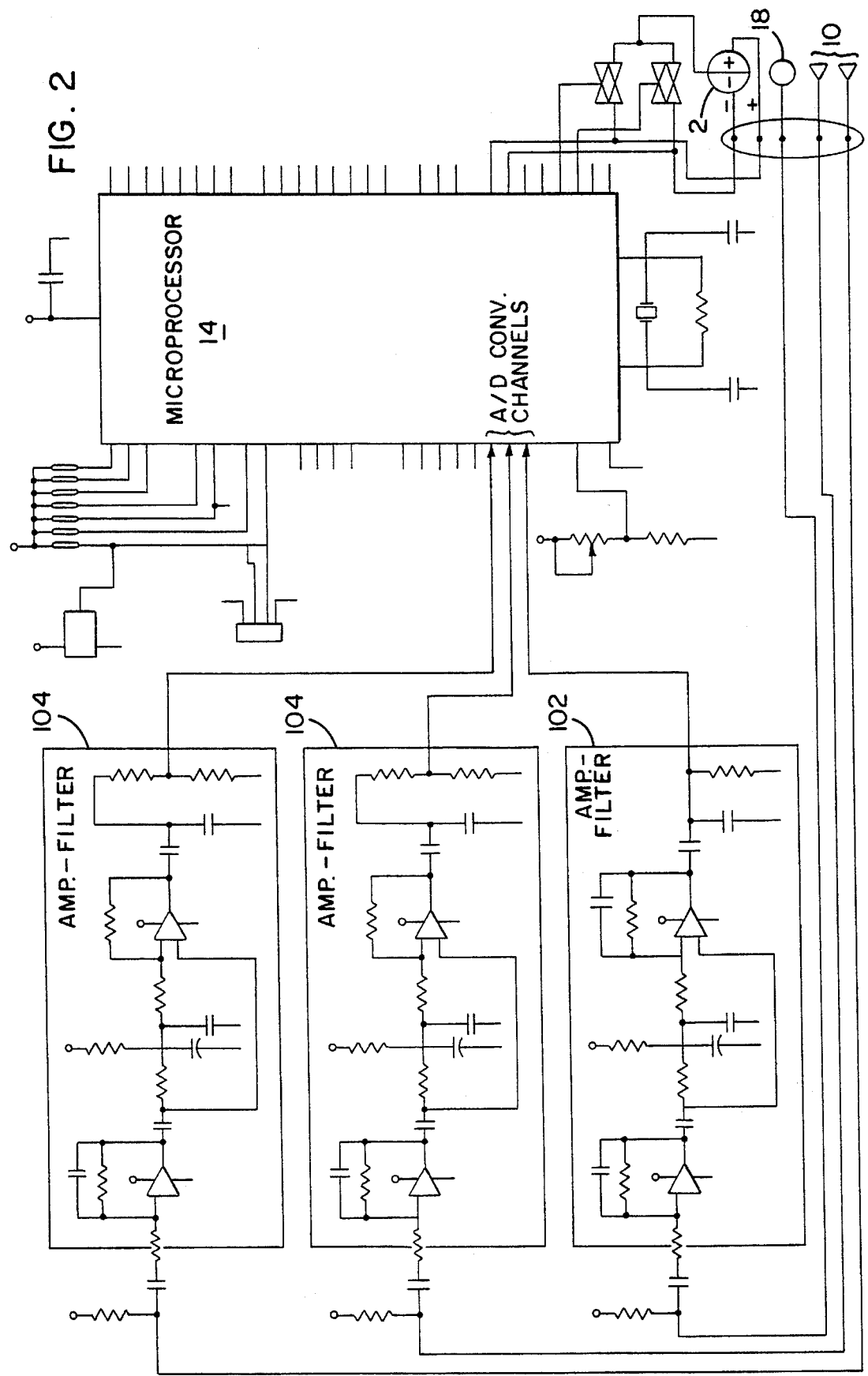

As shown diagrammatically in FIGS. 1 and 2, a radio unit 1 for cars comprises a volume adjustment button 2, several other operating buttons 4, a display device 6, an amplifying circuit 8 and at least two loudspeakers 10 (in general 4 loudspeakers).

The radio unit 1 also includes circuits connecting these various elements to a microprocessor 14 which controls the operation of the radio unit 1.

According to the invention, a microphone 18 is connected to provide an input to the microprocessor 14. The microphone 18 is located to pick up the noise in the vehicle's passenger space, so as to provide a signal representing all ambient sound perceived by the user, namely, sound reproduced by the radio unit 1, as well as the vehicle and all other noises, hereinafter referred to as, the disturbing noises.

Figure 3:
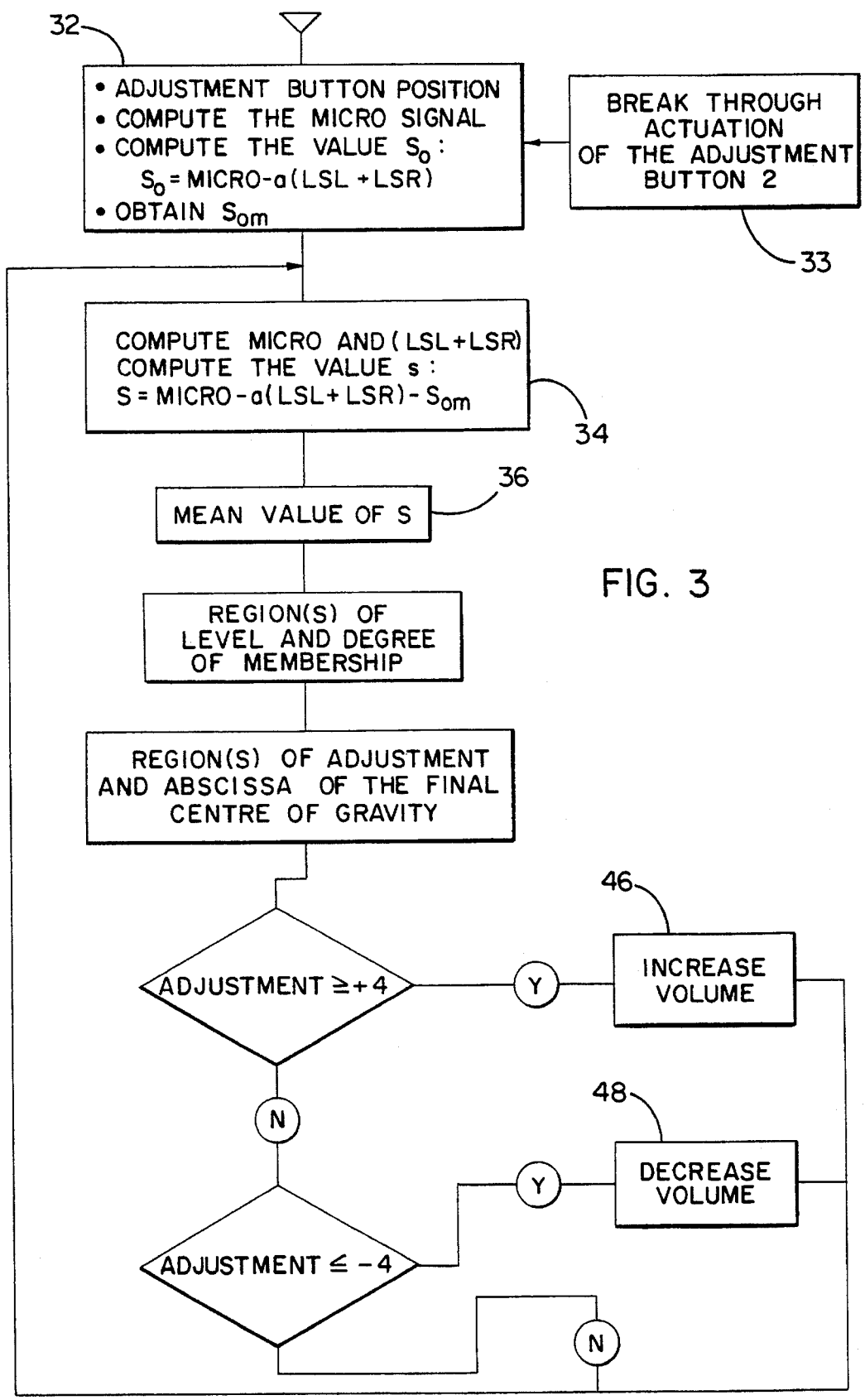

A program implementing the process which is the subject of the invention, schematically shown in the flow chart of FIG. 3, is executed by the microprocessor 14 and stored either internally to the microprocessor 14—in the preferred embodiment—or externally, i.e. in a memory circuit connected appropriately to the microprocessor 14.

According to the flow chart of FIG. 3, when the radio unit 1 is switched on, the program detects the position of the volume adjustment button 2 and in the absence of any modification by the user, assumes that this position corresponds to the wishes of the user, i.e. it affords the user the desired listening comfort.

The program then performs an initialization phase during which it evaluates the "listening comfort".

According to the invention, the program, in a first stage, performs a sampling and then an evaluation of the ambient noise. For this purpose, the signals picked up by the microphone 18 are conveyed (see FIG. 2) by way of an amp-filter 102 to the terminals of an "analog/digital" converter channel of the microprocessor 14, which is of the 68HC11 type in the preferred embodiment. The sampling ensures that the so-called integral value of the signal is obtained, in order to reduce the influence of instantaneous noises.

The microprocessor then performs a predetermined number of conversions, in the present example 100, and then computes the mean value, called "MICRO", of these conversions, so as to reduce the influence of any measurement errors due to electrical disturbances, any variations in voltage, etc.

Simultaneously, the microprocessor 14 receives, on two other "analog/digital" converter channels, the signals originating from the right (LSR) and left (LSL) channels (which may be simplified as the "LS" channels) connecting the output of the radio unit 1 amplifier to the loudspeakers 10

(for example the front loudspeakers). The input from the LS channels to the microprocessor 14 is shown by way of filters 104 (FIG. 2), so as to measure the value of the signals applied to these channels, and hence obtain the so-called integral value of the signal generated by the radio unit 1 alone.

Next, the microprocessor 14 computes the value of the signal representing the difference between that signal originating from the microphone (MICRO) and that signal originating from the radio unit 1. As indicated in block 32 in FIG. 3, the value obtained for this difference signal is:

SO="MICRO"-a (LSL+LSR),

"a" being a coefficient dependent on the type of circuits used and equal to 0.92 in the preferred embodiment The instantaneous value "$S_O$" therefore represents the instantaneous listening comfort, i.e. the difference between the sound picked up by the microphone 18 and therefore containing all the sound and noises (disturbances, etc.) and that delivered by the radio unit 1 alone.

Next, the program loads this instantaneous value "$S_O$" into a shift register which computes the mean value of a given number (for example, 35) of instantaneous values "$S_O$" so as to obtain a mean value ($S_{OM}$) representative of the signal "$S_O$" (block 32, FIG. 3) in such a way as to attenuate the instantaneous variations due to extremely brief signals (for example a horn, the banging of doors, etc.) which ought only minimally to influence the automatic adjustment device.

If during this initialization phase, the volume adjustment button 2 was not manipulated by the user (block 33 in FIG. 3), the program regards this mean value "$S_{OM}$" as valid, representing the listening comfort, since the user is satisfied with the level of reproduction of the radio unit 1 and it is taken as the reference value. Otherwise, the so-called initialization phase is performed again until the value of $S_{OM}$ is obtained. The value $S_{OM}$ is stored.

Next, the microprocessor under control of the program computes periodically S=MICRO-a (LSL+LSR) in the same way described above using new instantaneous values of MICRO and LSL+LSR, and the value of $S_{OM}$ (previously obtained during the initialization phase and stored in a register) is subtracted to obtain the value of "S" (block 34 in FIG. 3), which value gives magnitude and sign of any difference with respect to the value of $S_{OM}$. In the manner explained above, the mean value of "S" is obtained at the output of the shift register, i.e. the mean of 35 measurements.

Figure 4:
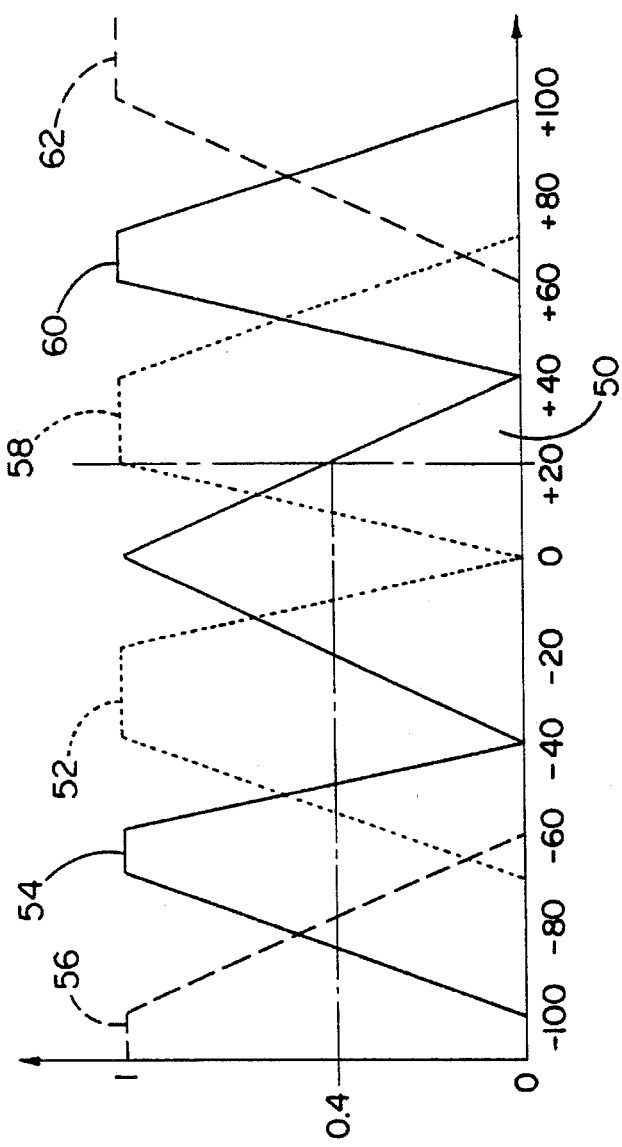

Then, the microprocessor which uses so-called "fuzzy" logic determines the degree of membership of this difference in various value regions represented diagrammatically in FIG. 4 by triangles and trapeziods to obtain an adjustment factor to control the level of sound delivered by the sound reproduction source. As indicated, this difference may be regarded as significantly negative 56, moderately negative 54, slightly negative 52, zero 50, slightly positive 58, moderately positive 60, or significantly positive 62.

"Fuzzy" logic is employed so as to prevent abrupt transitions from one region to another from being passed on, causing a sudden change in the adjustment of the volume of the radio unit 1.

If, for example, the difference is +20, then by plotting a parallel to the ordinate passing through the abscissa +20, it is observed that this difference is regarded as:

"zero" with a degree of membership of 0.4;

"slightly positive" with a degree of membership of 1.

Represented in FIG. 5, likewise in respect of "fuzzy" logic, are the possible regions of adjustment: zero 70, slightly negative 72, moderately negative 74, significantly negative 76, slightly positive 78, moderately positive 80 and significantly positive 82; each of these regions of adjustment corresponding to the type of difference having the same designation.

By transferring each degree of membership (obtained in FIG. 4) to the ordinate in FIG. 5, there are obtained, by plotting a parallel to the abscissa, for each region, in the present example a dotted region (slightly positive), a hatched region (zero), trapezoidal shapes defined by the abscissa, the outline of the relevant region and the parallel to the abscissa passing through the degree of membership.

The program then computes the centre of gravity of the trapeziod obtained for each reference region in FIG. 5, namely the points A and B, and then the centre of gravity of the entity obtained (point G) and its abscissa, giving the value of the adjustment factor.

Going back to the example, the program computes the centre of gravity (A) of the zero-adjustment trapezoid 70 bounded by the horizontal line passing through the 0.4 degree of membership (hatched region) and that of the slightly positive adjustment 78, taken as a whole since the degree of membership is 1 (dotted region). Next, the program computes the abscissa of the center of gravity (G) of the two trapeziods together, this being +8 thus signifying that the adjustment of the volume must be increased by the value +8.

As indicated in FIG. 5, the maximum values of adjustment are +50 and −50 while the adjustment button 2 of the set 1 has, in the preferred embodiment, 256 adjustment steps.

Depending on the type of radio unit 1 used and on the number of adjustment steps of the control 2, it is suggested not to make modifications of adjustments in a region close to the adjustment set by the user so as to preclude, on the one hand, a perpetual variation of the adjustment due to the fact that the noise level may be slightly variable without however impairing listening comfort and, on the other hand, of oscillations of the adjustment circuit. In the example used, which is a car radio, a variation in the volume adjustment arises only if the result of the "fuzzy" logic indicates a variation whose absolute value is greater than 4.

Consequently, in the program shown in FIG. 3, there are two steps 46, 48 which determine whether an adjustment is required and which make it when the value obtained is greater than +4, by increasing the volume by the desired number of steps, or less than −4 by decreasing the volume by the desired number of steps.

The modification by the number of steps is not done suddenly; quite the contrary, it takes place gradually so that the user does not "hear" this modification and has the sensation of benefiting constantly from the same listening comfort.

In this way, the adjustment faithfully follows the level of the "disturbing" noise and the user hears no sudden variation in level.

As indicated in FIG. 3, the program runs through the loop 40 for as long as the unit is working. The program is reinitialized by performing the steps indicated in block 32 each time the user himself modifies the adjustment of the volume by acting on the control 2 (block 33).

As hereinabove indicated, employing "fuzzy" logic makes it possible to obtain an adjustment of the volume which is more proportional to the results of the measurements of the noise and precludes both sudden changes of adjustment and oscillations, above all when the mean of the value of S is on the boundary of two regions of adjustment (for example slightly positive and significantly positive).

In motor vehicles, the microphone 18 is desireably placed in the passenger space at a level close to that of the head of the user so as to be able to give as faithful a representation as possible of what the user hears. It can in particular be placed such as to reduce the influence that there might perhaps be from a conversation held by people in the vehicle and/or perhaps equipped with an attenuator operated by the user.

By ensuring a reinitialization of the constants of measurements $S_{OM}$ with each manipulation of the adjustment button 2 by the user, the process ensures that the parameters are set as a function of the wishes of the user and hence of the "listening comfort" desired by the latter, while in the prior-art processes the new difference obtained inevitably operates a new adjustment of the amplifier, this going somewhat in the direction opposite to the desired effect since a new variation is added to that instigated by the user. Quite the contrary, the process which is the subject of the invention ensures that any modification made by the user is taken as a reference.

As an alternative, instead of mounting the microphone 18 in a particular location external to the radio unit 1 and within the vehicle, to make it less sensitive to sounds generated by people's conversation the microphone is mounted inside the car radio unit 1 and means are provided for removing or reducing the influence of people's conversation.

In this respect and recognizing that sounds generated by a conversation, composed of consonants and vowels, can be distinguished from ambient noise signals as represented by variations of levels quite distinctive from background noises without any conversation, or by speech delivered by the radio unit 1 but which are known through measurement of the signals applied to the loudspeakers (LSL+LSR), the process detailed hereinabove is improved by providing means for sampling signals representing sound delivered by the radio unit 1 between the steps (blocks) 34 and 35 shown at FIG. 4.

Figure 6:
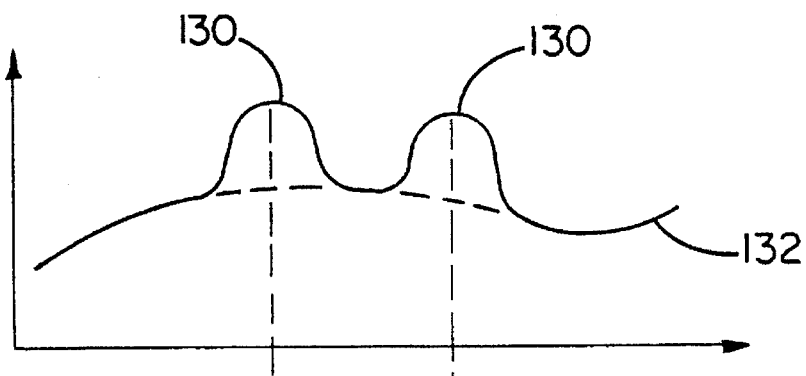

FIG. 6 represents signal values at the end of block 34.

Now, according to the above concept the scanning of the samples obtained (see FIG. 6a) by the process and their successive comparison allow detection of minimum and maximum values and thus of variations in level. Should a variation of level and more particularly a decrease of the level be steep enough, then it can be assumed with a very low error margin that the maximum value just preceding it is representative of sound generated by people's conversation.

Figure 6A:
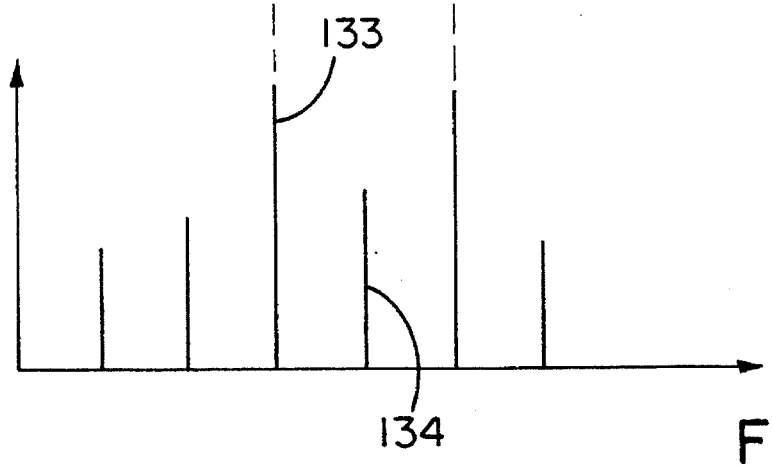

Accordingly, upon obtaining each sample 133, 134 (as shown in FIG. 6a) a sample corresponding to the mean value of 50 conversions (for example) is made by the microprocessor 14; the value of the sample 134 is compared to the value of the preceding sample 133 to determine whether it is smaller or larger than the value of the sample 134, the process determining if this difference is greater or not than a preset value, for instance 3.

Figure 6B:
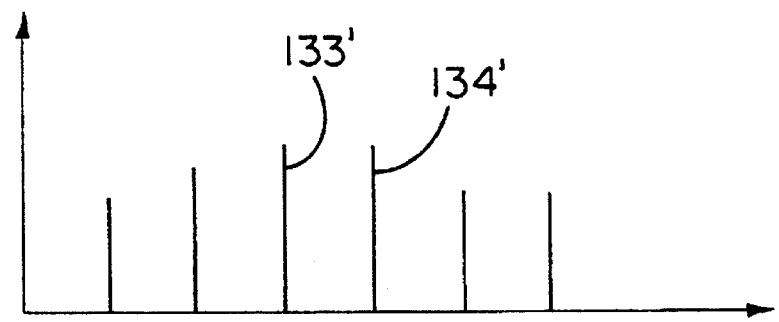

If it is a greater value, the penultimate value 133 (or sample) obtained is considered as representing a part of the conversation (maximum value) and is then advantageously replaced (133', FIG. 6b) by the last obtained value 134' (value at least equal to the maximum value minus 3—FIG. 6b). As can then be recognized, the samples obtained at FIG. 6b represent more accurately the noise and audio output of the radio unit 1 because surge signals from people's conversation (130) have been largely eliminated. This value is then transmitted to the shift register for computing the mean value of a given number of samples, in the present case 110 (instead of 35 as in the original embodiment). Therefore, the mean value which is obtained is not influenced by a conversation and hence represents more accurately the ambient noise and/or disturbing noise of the vehicle. Thus, the control of the volume according to the listening comfort is more accurate as not influenced by a conversation and no great attention has to be paid by the user to the installation of the microphone in a particular location.

What is claimed is:

1. A process for automatic control of the adjustment of volume of sound delivered from a sound reproduction source comprising the steps of:

(a) providing an ambient sound signal (MICRO) having a value representing level of ambient sound perceived by a user including sound delivered from the source and disturbing noises;

(b) providing a delivered sound signal (LS) having a value representing level of sound delivered by the sound reproduction source;

(c) determining instantaneous values of $S_O$=MICRO−a LS (wherein a is a constant determined by circuit parameters) and computing an average value ($S_{OM}$) during an initialization phase representing a user's listening comfort level, taking into account initial intensity of disturbing noises;

(d) periodically, subsequent to the initialization phase, repeating steps (a) and (b);

(e) determining, with the results of step (d) and the value of $S_{OM}$ obtained during the initialization phase, instantaneous values of $$S=MICRO-a\ LS-S_{OM}$$

and computing an average value of S based on a number of instantaneous values of S to provide a difference value, having both magnitude and sign, with respect to the value of the user's listening comfort level $S_{OM}$, thereby taking into account a difference in intensity of disturbing noises; and (f) determining an adjustment factor based on the average value of S and adjusting the volume of sound delivered by the sound reproduction source in accordance with the adjustment factor so that the user has the sensation of listening to delivered sound which is maintained at a substantially constant level regardless of intensity of the disturbing noises.

2. A process for automatic control of the adjustment of volume of sound delivered from a sound reproduction source comprising the steps of:

(a) providing an ambient sound signal (MICRO) having a value representing level of ambient sound perceived by a user including sound delivered from the source and disturbing noises;

(b) providing a delivered sound signal (LS) having a value representing level of sound delivered by the sound reproduction source;

(c) determining an initialization difference value based on a number of instantaneous values of MICRO−a LS (wherein a is a constant determined by circuit parameters) during an initialization phase representing a user's listening comfort level and storing the initialization value, taking into account initial intensity of disturbing noises;

(d) periodically, subsequent to the initialization phase, repeating steps (a) and (b);

(e) determining, with the results of step (d) and the stored initialization value, an operating difference value having both magnitude and sign with respect to the value of the user's listening comfort level, thereby taking into account a difference in intensity of disturbing noises; and (f) determining an adjustment factor based on the operating difference value and adjusting the volume of sound delivered by the sound production source in accordance with the adjustment factor so that the user has the sensation of listening to delivered sound which is maintained at a substantially constant level regardless of intensity of the disturbing noises.

3. A process according to claim 2, wherein the operating difference value obtained in step (e) is compared in step (f) with regions of values quantifying the difference value so as to determine the degree of membership thereof to base the determination of the adjustment factor.

4. A process according to claim 3, wherein the degree or degrees of membership thus determined are applied to corresponding regions of adjustment to determine the adjustment factor to be applied to the adjustment of the volume.

5. A process according to claim 2, wherein every manipulation of a volume adjustment button by the user starts steps (a)-(c) of a new initialization phase to determine the average value of $S_{OM}$ representing the user's listening comfort level.

6. A process according to claim 2, wherein the average value of $S_{OM}$ is determined over a predetermined time period so as to obtain a mean average value.

7. A process according to claim 4, wherein the adjustment of the volume of sound takes place when the adjustment factor exceeds a preset constant.

8. A process according to claim 2 including the further sub-steps in step (e) in providing an operating difference value:

(a-1) comparing successive operating-difference-value samples to determine a difference value between penultimate and last samples;

(a-2) determining whether the difference value from (a-1) is greater or not than a preset value and, if the difference value from (a-1) is greater than a preset value;

(a-3) determining the adjustment factor based on values represented by the last sample and eliminating the penultimate sample as representing a surge signal resulting from people's conversation.

9. An automatic control apparatus for the adjustment of volume of sound delivered from speakers of a sound reproduction source comprising:

a microphone mounted adjacent a location occupied by a user and connected to amplifier circuits providing an ambient sound signal (MICRO) having a value representing level of ambient sound perceived by a user including sound delivered from the source and disturbing noises;

circuits including an amplifier connected to detect a delivered sound signal (LS) having a value representing level of sound delivered by the speakers;

computer means operating under the control of a program to:

(1) determine an initialization difference value based on a number of instantaneous values of MICRO–a LS (wherein a is a constant determined by circuit parameters) during an initialization phase representing a user's listening comfort level and store the initialization value, taking into account initial intensity of disturbing noises;

(2) periodically, subsequent to the initialization phase, provide the MICRO ambient sound signal and the LS delivered sound signal;

(3) determine, using the results of (2) and the stored initialization value, an operating difference value having both magnitude and sign with respect to the value of the user's listening comfort level, thereby taking into account a difference in intensity of disturbing noises; and (4) determine an adjustment factor based on the operating difference value; and means for adjusting the volume of sound delivered by the speakers in accordance with the adjustment factor so that the user has the sensation of listening to delivered sound which is maintained at a substantially constant level regardless of intensity of the disturbing noises.

10. An apparatus according to claim 9, wherein the microphone is mounted to the sound reproduction source and wherein the computer means operates under control of the program to:

(5) sample the operating difference value from step (3);

(6) compare successive samples from (5) to determine a difference value between penultimate and last samples;

(7) determine whether the difference value from (6) is greater or not than a preset value and, if the difference value from (6) is greater than a preset value;

(8) determine the adjustment factor based on values represented by the last sample and eliminate the penultimate sample as representing a surge signal resulting from people's conversation.

* * * * *